United States Patent [19]

Chang et al.

[11] 4,184,909

[45] Jan. 22, 1980

[54] METHOD OF FORMING THIN FILM INTERCONNECTION SYSTEMS

[75] Inventors: Kenneth Chang, Hopewell Junction; David C. Cosman, Newburgh; Helmut M. Gartner; Anthony J. Hoeg, Jr., both of Wappingers Falls, all of N.Y.

[73] Assignee: International Business Machines Corporation, Armonk, N.Y.

[21] Appl. No.: 935,286

[22] Filed: Aug. 21, 1978

[51] Int. Cl.$^2$ .................... C23F 1/02; C03C 15/00; C03C 25/06
[52] U.S. Cl. .................... 156/643; 156/646; 156/656; 156/657; 156/659.1; 204/192 EC; 204/192 E; 357/71; 427/90
[58] Field of Search .................... 427/88–91; 357/71; 29/580, 591; 156/643, 653, 656, 657, 659, 661, 662, 646; 204/192 EC, 192 E, 164, 298

[56] References Cited

U.S. PATENT DOCUMENTS

| | | | |
|---|---|---|---|
| 3,914,127 | 10/1975 | Buss et al. | 156/643 |
| 3,971,684 | 7/1976 | Muto | 156/643 |
| 3,994,793 | 11/1976 | Harvilchuck et al. | 204/192 |
| 4,090,006 | 5/1978 | Havas et al. | 156/643 X |

OTHER PUBLICATIONS

IBM Technical Disclosure Bulletin, vol. 9, No. 9, Feb. 1967, Preferential Ion Etch Technique with Reactive Sputtering by R. Tsui, p. 1070.
IBM Technical Disclosure Bulletin, vol. 16, No. 6, Nov. 1973, Etching of SiO$_2$ Using Plasma by R. Anderson et al., p. 1892.
IBM Technical Disclosure Bulletin, vol. 19, No. 9, Feb. 1977, Forming Planar Integrated Circuit Metallization, by Metzger et al., pp. 3364–3365.

Primary Examiner—William A. Powell
Attorney, Agent, or Firm—David M. Bunnell; Thomas F. Galvin

[57] ABSTRACT

A method for forming thin film interconnection patterns atop substrates, particularly semiconductor substrates. It features the use of the passivation layer itself, typically glass, as a stable masking material to etch the conductive lines. Conversely, the metal conductor is used as a stable mask in etching the glass to form via holes. The process provides a practical resist system which is compatible with reactive ion etching or other dry etching process.

19 Claims, 14 Drawing Figures

METHOD OF FORMING THIN FILM INTERCONNECTION SYSTEMS

BACKGROUND OF THE INVENTION

1. Technical Field

This invention relates to the fabrication of semiconductor devices. More particularly, it relates to the fabrication of interconnection metallurgy systems atop the semicondutor devices.

2. Background Art

Advances in modern semiconductor device technology have allowed increasing numbers of devices and circuits to be fabricated within a single semicondutor chip. This has required increasing microminiaturization of the interconnection metallurgy system connecting the elements within the chip into circuits. Such miniaturization results in decreased costs and improved performance in integrated circuits but is constantly crowding the fabrication technology, particularly the photolithographic and etching techniques of the interconnection metallurgy.

In integrated circuit design, for example, thousands of impurity regions are conventionally fabricated in a silicon chip, approximately 125–200 mils square. Such regions form transistors, diodes, resistors and the like which are then connected together by thin film wiring patterns atop the chip to form various circuits and for connection to input-output terminals.

This interconnection thin film system atop the chip is extremely complex and usually employs two or three separate levels of complex conductive patterns, each separated by one or more layers of dielectric material. Ordinarily, the first level conductive pattern on the chip surface interconnects the transistors, resistors, diodes, etc. into circuits and also provides for circuit-to-circuit connections. The second level conductive pattern conventionally completes the circuit-to-circuit connections and makes contact to I/O terminals which are connectable to a support such as a module, substrate or card. Alternatively, a third level may be required for power and I/O connections. Four levels of metallization may be required in future products.

At present, the formation of such thin film patterns is accomplished primarily by etching in the presence of etch-resistant photoresist layers. The process involves the traditional photolithographic wet-etching of both the thin film as well as the photoresist layers.

These relatively old and well-known techniques have been eminently successful. However, with the continued miniaturization of semiconductor integrated circuits to achieve greater component density and smaller units of large scale integrated circuitry, the art is rapidly approaching a point where wet etching may become impractical for providing the minute resolution required for the fine line definition of metallization.

Wet etching of thin films may be used in either electron beam or optical exposure systems. However, it often results in the contamination of the metal, primarily due to particles within the etching solution itself. In addition to the purity and composition of the etchant, the duration of the etching must be carefully controlled to prevent under or over-etching of the thin film.

Dry etching, in particular plasma or reactive ion etching, has in relatively recent times come to be recognized as a practical alternative to wet etching. Contamination may be less of a problem; and the etching equipment assures adequate process control of the most precise thin film patterns.

One of the problems associated with plasma etching of thin films, however, is that most of the well-known and commonly used optical and electron beam resist materials cannot withstand the processing intact. The resists tend to flow during the etching process, apparently because of their reactions with the gaseous ions and the temperature of the semiconductor substrate, typically around 200° C. or more. Thus, it would be desirable to be able to plasma etch a single photoresist material directly over a metallic thin film to define the desired conductive pattern. The resist would then be used as a mask and the exposed metal etched away, typically by another gas which attacks the metal but not the photoresist. The remaining photoresist would then be removed in the conventional manner to leave the desired thin film pattern.

To our knowledge there is no practical way to accomplish this. A number of different resist materials and reactive gases have been tried, but with little success.

One alternative solution to this problem is described in U.S. Pat. No. 4,092,442, issued in the names of R. K. Agnihotri and H. C. Kluge. They found that a polyimide mask can withstand the conditions of reactive ion etching, which conditions cause other common resist materials to disintegrate. They use this property by depositing the polyimide layer atop the thin film layer or layers, followed by the application of the resist layer. Both the resist and polyimide layers are exposed. The resist is developed, and the polyimide is etched, thereby exposing portions of the underlying thin film layer. The exposed portions of the thin film are then etched in a plasma gas. The action of the plasma gas also removes the remaining resist layer. The polyimide layer protects the unexposed thin film from attack by the plasma gas.

Although successful, the process of Agnihotri and Kluge requires the added steps of applying, exposing and removing the polyimide. These add to the cost of manufacturing process and are potential detractors from the product yield.

SUMMARY OF THE INVENTION

Accordingly, it is a primary object of our invention to provide an improved method for depositing thin films atop substrates.

It is another object of our invention to achieve an informed method of etching thin film patterns by dry etching techniques, particularly plasma etching.

It is yet another object of our invention to perform such plasma etching while using sensitive resist materials for defining said thin film patterns.

These and other objects and advantages of our invention are achieved by using the passivation layer itself as a stable masking material to etch the conductors into a conductive pattern. Conversely, the conductive material is used as a stable mask in etching the passivation layer to form via holes between the levels of conductors.

The process is particularly advantageous when dry etching, such as RIE, is used to form the conductive and via hole patterns because the resist material, which cannot withstand the etching condition, is not used as a mask when said patterns are formed in the RIE chamber.

DESCRIPTION OF THE PREFERRED EMBODIMENT

Figure 1A:
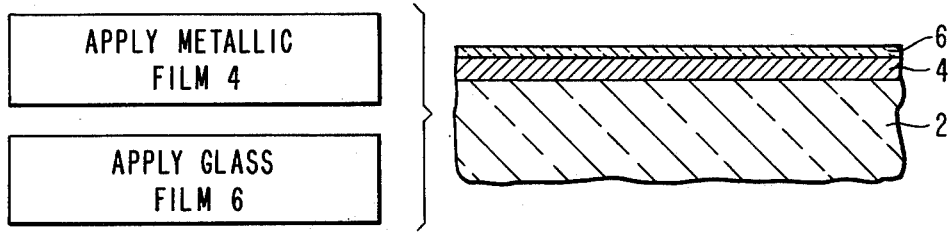
FIGS. 1A-1L are diagrammatic, cross-sectional views of a structure being fabricated in accordance with the preferred embodiments of the present invention. The figures also include a flow chart describing each of the steps.

By reference to the Figures there will now be described the preferred method of the present invention.

The structure in these figures is a portion of an integrated circuit chip which may be formed by any of the conventional integrated circuit fabrication techniques. In our preferred embodiment, substrate 2 is typically an insulator such as silicon dioxide, silicon nitride or a composite of silicon dioxide and silicon nitride. In the usual process the substrate is disposed atop a silicon semiconductor body (not shown). Openings, not illustrated, are provided to contact regions in underlying semiconductor layer to the conductor patterns formed on the surface of substrate 2. For purposes of clarity and conciseness, the Figures, which illustrate the preferred embodiment of the process, omit illustration of the silicon semiconductor body as well as the contact openings in insulating layer 2.

Although our preferred embodiment contemplates the formation of a first thin film pattern which is connected to regions within a semiconductor body followed by second and third levels of metallization, our process may also begin with the second and/or third levels of metallization. Moreover, it is not limited to patterns formed atop semiconductor substrates but is applicable to other types of substrates as well.

Deposited atop substrate 2 is a thin film 4 which is to be patterned. In our preferred embodiment, thin film 4 may be any metal or conductive material which is conventionally used for integrated circuit metallization, e.g., aluminum, aluminum-copper-silicon alloys, doped silicon, platinum, palladium, chrome or molybdenum. In addition, tantalum or alloys of titanium-tungsten are suitable. Moreover, thin film 4 may be a composite layer of more than one metal. The thin film is deposited in conventional fashion by evaporation or sputtering and typically has a thickness in the order of one micrometer.

Next, a thin film of glass 6 is deposited atop metal film 4. Glass film 6 is to act as a mask for the subsequent etching of metal film 4. Thus, it may be made very thin, advantageously around 0.3 micrometer; this is not critical. The glass may be applied by sputtering or by chemical vapor deposition.

Figure 1B:
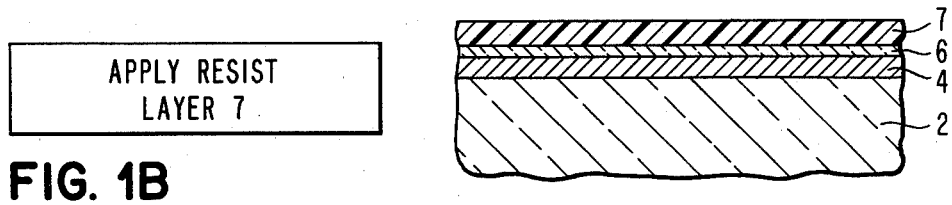

Turning now to FIG. 1B, a layer of photoresist 7 is applied over the glass layer 6. This may be any conventional optical or electron resist but is preferably a resist which may be exposed by an electron beam such as AZ-1350J, KTFR and PMMA. For example, the resist is applied to a thickness of around one-half to one and one-half micrometers. It is then baked in conventional fashion. The thickness of the resist may be quite small, which is an advantage for pattern alignment in E-Beam exposure systems, because glass film 6 may be very thin.

In addition to PMMA, which is a positive electron resist material, any number of sensitive electron or optical resists may be used. For example, the positive resists marketed by the Shipley Company, under the names of AZ 1350H, AZ 1350J and AZ 111 and the negative resists marketed by the Hunt Chemical Company, known as Waycoat IC, and by the Eastman Kodak Company, under the names of KTFR, KMER, KPR-2, and KPR-3 may be used. The techniques for applying, exposing and developing these resists either by electron beam or U.V. light are well known to those of skill in the art.

Figure 1C:
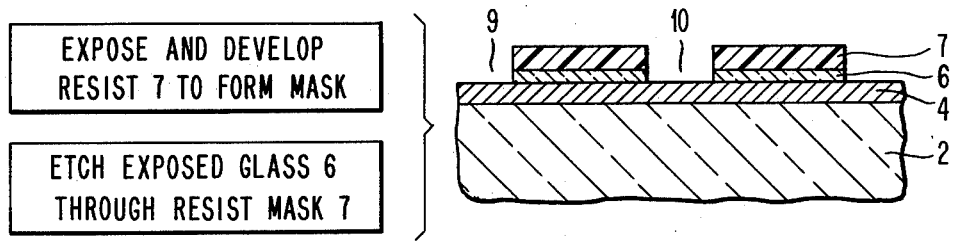

Returning now to the preferred process in FIG. 1C, the resist is exposed selectively to form a desired pattern. After exposure is complete, resist 7 is developed with a dilute organic or inorganic base solution. This process removes the selected portions of the resist.

Portions of glass film 6 are thereby exposed through windows in layer 7. Layer 6 is then etched, typically with buffered HF, using resist layer 7 as a mask. When this step has been completed, windows 9 and 10 have been opened to the thin film 4, as illustrated in FIG. 1C. The remainder of resist layer 7 may then be stripped either by wet chemical means or by ashing.

The structure is then subjected to a dry plasma etching (RIE) process using a reactive gas which etches the exposed portions of metal 4 and using glass film 6 as the mask. If the resist layer 7 had not been stripped at this point, the etching process would also cause the remainder of photoresist 7 to be etched away. The reactive gas is preferably $CCl_4$, which attacks conventional metallic films such as those hereinbefore enumerated. Other gases which may be used include HCl, $Cl_2$, HBr, $Br_2$, and trichloroethylene. Freons of chlorohalogens such as $FCCl_3$, $F_2CCl_2$, as well as FCl, FOCl, etc. are also effective.

Figure 1D:
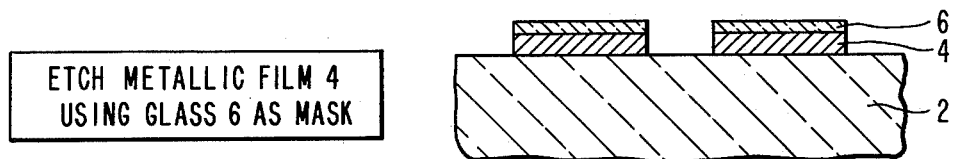

Due to the plasma etching step, thin film layer 4 is patterned in the desired fashion as shown in FIG. 1D.

Glass layer 6, which has served as the mask when etching metal film 4 remains atop the metal, as there is no need to remove it. It remains as a stable passivator for the underlying metal pattern 4.

Figure 1E:
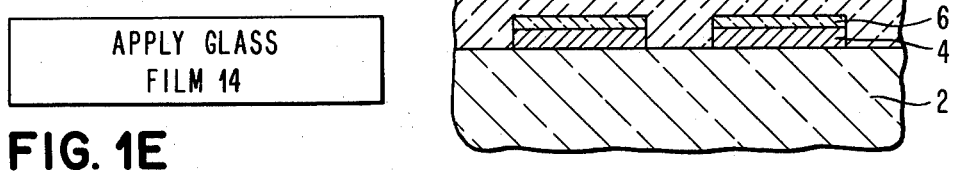

In FIG. 1E a second glass film 14 is blanket-deposited atop the substrate to serve as the insulator between the first level of metallization shown and the second level of metallization to be applied in later steps. Typically, the thickness of layer 14 is around 1-2 micrometers or more. As used in this specification, the term glass includes silicon dioxide, silicon nitride and other compounds commonly used as insulators or passivators.

Some of the advantages of our invention, as compared to the prior art, are evident in the five figures described so far. In the first place, the glass passivation layer 6 is itself used as a stable masking material, rather than photoresist 7. This is particularly important when the metal film is etched in the RIE chamber because, as previously noted, the resist mark will erode during RIE processing. By not using the resist as a mask during the etching of film 4, this problem is minimized, irrespective of whether the resist layer is removed prior to etching in the RIE chamber or not.

Another advantage of our process is that standard, well-known materials and processes are used in the fabrication process. Each of the materials used is conventional at the present state of the art.

After glass layer 14 has been deposited by conventional techniques such as sputtering or chemical vapor deposition, a conductive film 16 is deposited atop glass layer 14. This film, like thin film 4, may be any metal which is conventionally used for integrated circuit metallization and is preferably aluminum. It will be used both as a mask to form via holes through insulating layers 14 and 6 and will also be used as a portion of the second level conductive pattern atop the chip. Because the metal film 16 is to act as a mask for the subsequent etching of the glass layers underneath, it may be made very thin, advantageously around 0.3 micrometers. As with glass film 6, this is not critical. The metal may be applied by conventional sputtering or evaporation techniques.

Figure 1F:
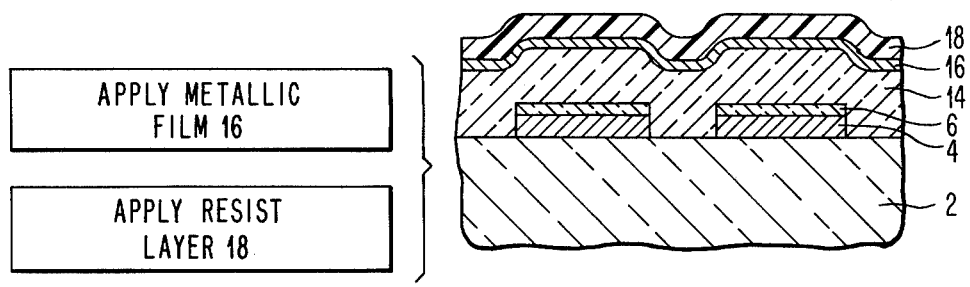

Returning to FIG. 1F, a layer of resist 18 is applied over metallic film 16. This may be the same type and thickness of resist as has been discussed with respect to FIGS. 1B and 1C in preceding sections of this specification.

Figure 1G:
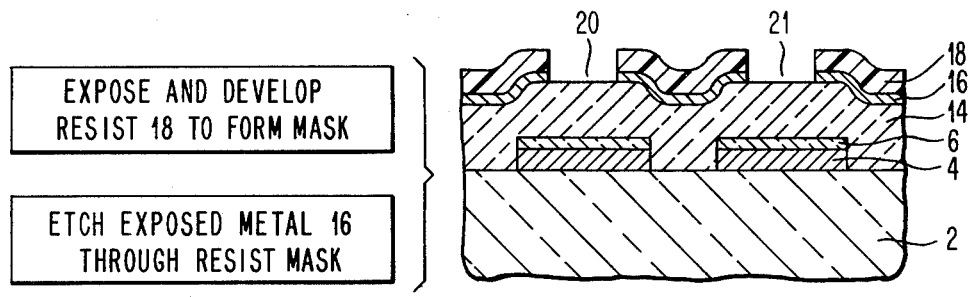
Figure 1H:
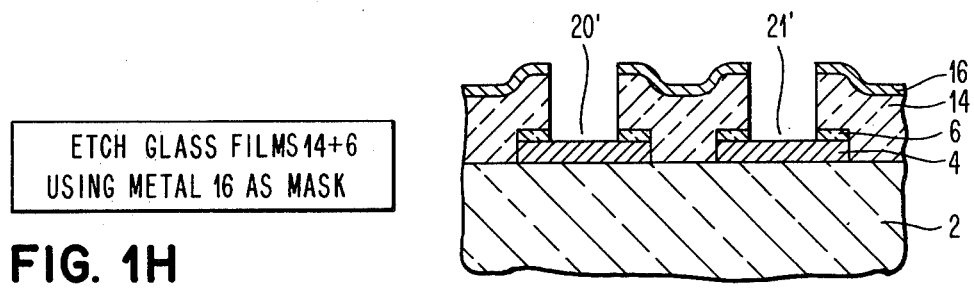

Turning to FIG. 1G, the resist is exposed selectively to form a desired pattern for etching via holes through glass layers 14 and 6 to the first level conductive pattern 4. After exposure is complete, resist 18 is developed to remove the selected portions of the resist. Portions of metal film 16 are thereby exposed through the windows in layer 18. Metallic film 16 is then etched, using an appropriate etchant which does not substantially attach resist 18 or glass layer 14. For example, when Al or Al-Cu is used for the metallization, then a mixture of phosphoric and nitric acid may serve as the etchant. This leaves windows 20 and 21 through resist layer 18 and conductive film 16 to expose portions of glass layer 14. Resist layer 18 may then be stripped by conventional techniques; and via holes 20' and 21' may be etched into the quartz either by RIE or wet chemical methods. When the former technique is used, the present process has the advantage, as previously discussed, that a resist layer is not used as a mask during the dry etching. Metal film 16 acts as the mask.

Figure 1I:
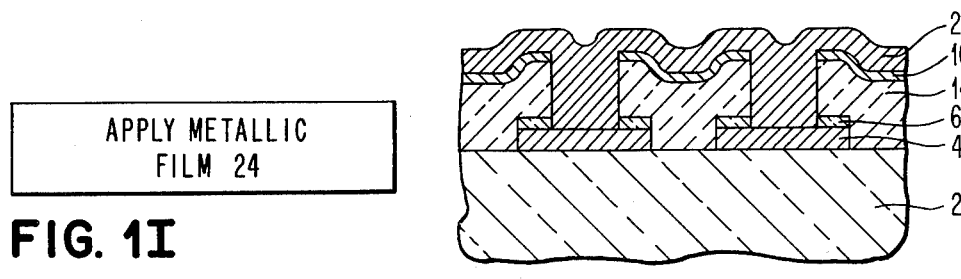

Turning to FIG. 1I, a conductive layer 24 is then deposited in blanket fashion atop mask 16 and within via holes 20' and 21'. This serves to connect the first level of metallization 4 with the second level of metallization 24, the latter being as yet unpatterned.

In our preferred embodiment, thin film 24 may be any of the previously enumerated metals conventionally used for integrated circuit metallization. Advantageously, it is aluminum. Thin film 24 is deposited in conventional fashion by evaporation or sputtering and typically has a thickness in the order of one and one-half micrometers.

In cases where the via holes 20' and 21' are undercut, it may be necessary to deposit metal 24 by sputtering to insure complete continuity of film 24 within the via holes.

Figure 1J:
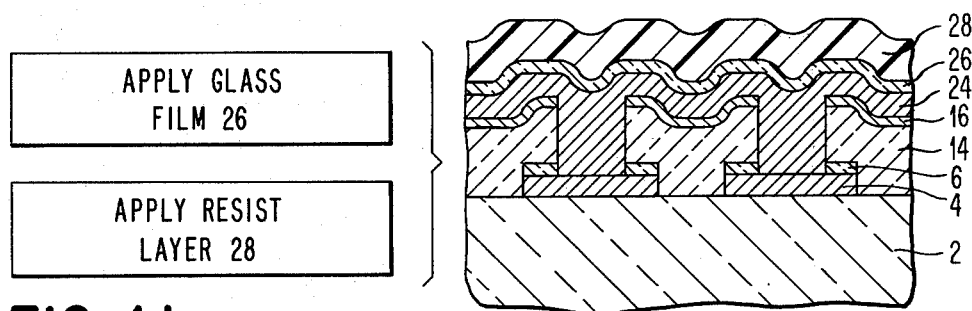

Turning to FIG. 1J, a thin glass film 26 is deposited. Glass film 26 is to act as a mask for the subsequent etching of metal film 24. As with film 6, it may be made very thin, advantageously around 0.3 micrometers and may be applied by sputtering or by evaporation.

A layer of resist 28 is then applied over the glass layer 26. This may be any conventional optical or electron resist as previously discussed with respect to resist layer 7. This resist is applied to a thickness of around one-half to one and one-half microns and baked in conventional fashion.

Figure 1K:
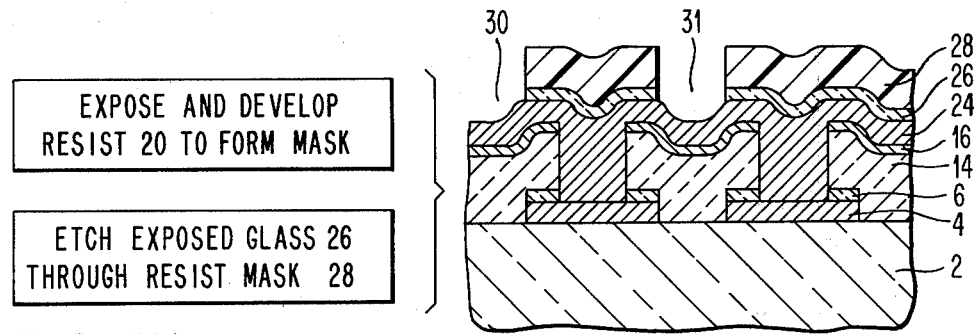

Returning now to the preferred process in FIG. 1K, resist 28 is exposed selectively to form a desired pattern. After exposure is complete, resist 28 is developed with a dilute organic or inorganic base solution. This process removes the selected portions of the resist.

Portions of glass film 26 are thereby exposed through windows in layer 28. Layer 26 is then etched, typically with buffered HF, using resist layer 28 as a mask. When this step has been completed, windows 30 and 31 have been opened to the thin film 24, as illustrated in FIG. 1K. The remainder of resist layer 28 may then be stripped.

The structure is then subjected to a dry plasma etching process using a reactive gas which etches the exposed portions of metal 24 and metal 16. If the resist layer 28 has not been stripped at this point, the etching process also causes the remainder of photoresist 28 to be etched away. The reactive gas is preferably $CCl_4$ or others which have been enumerated previously. Wet chemical etching could also be used.

Figure 1L:
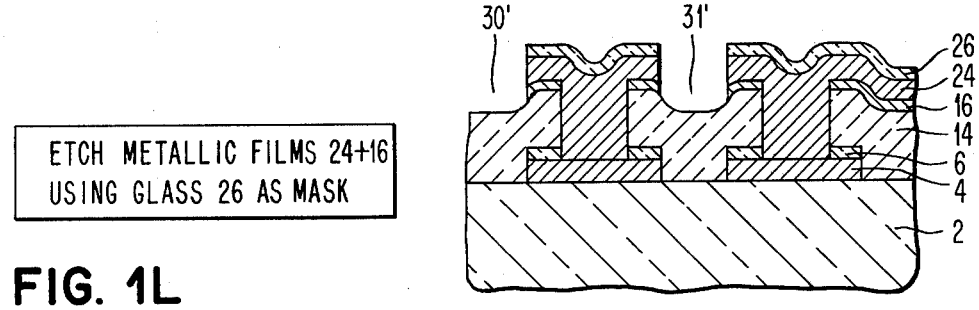

Due to the plasma etching step, thin film layer 24 is patterned in the desired fashion as shown in FIG. 1L to form the second level of metallization which is connected through glass layers 14 and 16 to the first level.

Glass layer 26, which has served as the mask when etching metal film 4 remains atop the metal. It remains as a stable passivator for the underlying metal pattern 24.

The advantages of our invention are also evident at this point. The glass passivation layer 26 is itself used as a stable masking material, rather than photoresist 28. This is particularly important when metal films 24 and 16 are etched in the RIE chamber because the resist mask will erode during RIE processing.

The steps for forming third and fourth levels of metallization atop the structure, if required, are substantially the same as for the second level.

Therefore, the description of the remainder of the process is abbreviated to avoid unnecessary details.

Figure 2:
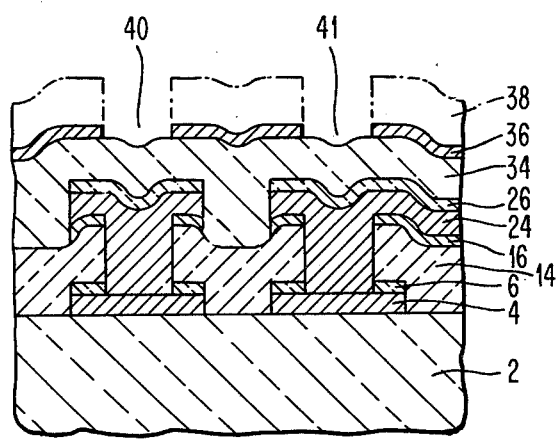
FIGS. 2 and 3 are diagrammatic, cross-sectional views of the structure during later steps of the process.
Figure 3:
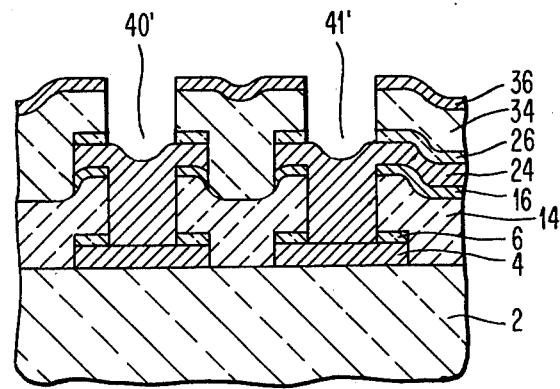

In FIG. 2 a fourth glass film 34 is blanket-deposited atop film 26 and in the spaces between pattern 24 to serve as the insulator between the second level of metallization shown and the third level of metallization to be applied in later steps.

After glass layer 34 has been deposited, a thin conductive film 36, such as aluminum, is deposited atop glass layer 14. It is used both as a mask to form via holes through insulating layers 34 and 26 and will also be used as a portion of the third level conductive pattern atop the chip.

A layer of resist 38 is applied over metallic film 36. This may be of the same type of resist as has been discussed previously. The resist is exposed selectively to form a desired pattern for etching via holes through glass layers 34 and 26 to the second level conductive pattern 24. After exposure is complete, resist 38 is developed, and portions of metal film 36 are thereby exposed through the windows in layer 38. Metallic film 36 is then etched, typically using an etchant which does not substantially attack resist 38 or glass layer 34. This leaves windows 40 and 41 through resist layer 38 and conductive film 36 to expose portions of glass layer 34. Resist layer 38 may then be stripped by conventional techniques, and via holes 40' and 41' may be etched into the quartz either by dry etching or wet chemical etching methods. When the former technique is used, the present process has the advantage as previously discussed that no resist layer is used as a mask during the dry etching. Metal film 36 functions as the mask.

A conductive layer (not shown) may then be deposited in blanket fashion atop mask 36 and within via holes 40' and 41' for the third level of metallization. The patterning process follows the steps already given for the second level of metallization.

To summarize, we have invented an improved method for forming thin film interconnection systems atop substrates. In our preferred embodiment, we use a glass passivation layer itself as a stable masking material to etch the metal lines into metallization patterns. Conversely, the metal conductor is used as a stable mask in etching the glass passivator to form via holes.

We are thus able to avoid the need for resist materials in etching said conductive patterns and via holes; and the etching may thereby be accomplished in a reactive ion etching chamber.

Our process is adaptable to provide virtually as many levels of metallization as may be desired.

Although the invention has been particularly shown and described with reference to the preferred embodiments thereof, it will be understood by those skilled in the art that the foregoing and other changes in form and details may be made therein without departing from the spirit and scope of the invention.

We claim:

1. A method for fabricating thin film interconnection systems atop a substrate comprising:
   depositing a first thin film on a substrate;
   depositing a second thin film on said first thin film;
   said first and second films being selectively etchable with respect to each other;
   forming a first resist layer on said second thin film;
   forming openings through said first resist layer and second thin film extending to said first thin film, thereby exposing selected portions of said first thin film;
   etching the exposed portions of said first thin film by using said second thin film as a mask, whereby the remaining first thin film is in a desired pattern;
   depositing a third thin film having the same etching characteristics as said second thin film atop said second thin film;
   depositing a fourth thin film atop said third thin film;
   said third and fourth films being selectively etchable with respect to each other;
   forming a second resist layer on said fourth thin film;
   forming openings through said second resist layer and fourth thin film extending to said third thin film, thereby exposing selected portions of said third thin film; and
   etching the exposed portions of said third and second thin films using said fourth thin film as a mask, whereby selected portions of said first thin film are exposed.

2. A method as in claim 1 further comprising the step of depositing a fifth thin film onto said exposed portions of said first thin film.

3. A method as in claim 2 wherein:
   said first, fourth and fifth thin films are conductive; and
   said second and third thin films are insulative.

4. A method as in claim 3 wherein:
   said conductive films comprise metal; and
   said insulative films comprise glass.

5. A method as in claim 4 wherein said step of depositing said fifth metal film comprises sputtering.

6. A method as in claim 2 further comprising the steps of:
   depositing a sixth thin film on said fifth thin film;
   said fifth and sixth thin films being selectively etchable with respect to each other;
   forming a third resist layer on said sixth thin film;
   forming openings through said third resist layer and sixth thin film extending to said fifth thin film, thereby exposing selected portions of said fifth thin film;
   etching the exposed portions of said fifth thin film using said sixth thin film as a mask, whereby the remaining fifth thin film is in a desired pattern.

7. A method as in claim 6 wherein said steps of etching the exposed portions of said fifth thin film is accomplished by reactive ion etching.

8. A method as in claim 6 wherein:
   said first, fourth and fifth thin films are conductive; and
   said second, third and sixth thin films are insulative;
   whereby said conductive films form a two-level conductive interconnection system atop said substrate.

9. A method as in claim 8 wherein:
   said conductive films comprise metal; and
   said insulative films comprise glass.

10. A method as in claim 1 wherein said steps of depositing said thin films are accomplished by sputtering.

11. A method as in claim 1 wherein said second and fourth thin films are substantially thinner than said first and third thin films.

12. A method as in claim 11 wherein said first and second resist layers have a thickness of between 0.5 and 1.5 micrometers to facilitate pattern alignment.

13. A method as in claim 1 wherein said step of etching the exposed portions of said first thin film is accomplished by reactive ion etching.

14. A method as in claim 1 wherein said step of etching the exposed portions of said third and second thin films is accomplished by reactive ion etching.

15. A method for fabricating thin films atop a substrate comprising:
   depositing a first conductive thin film on a substrate;
   depositing a first glass thin film on said first conductive film;
   forming a first resist layer on said first glass thin film;
   forming openings through said resist in said first glass thin film extending to said first conductive thin film, thereby exposing selected portions of said first thin film;
   removing the exposed first conductive thin film by plasma etching using said first glass thin film as a mask, whereby the remaining first conductive thin film is in the desired pattern;
   depositing a second glass thin film atop said first glass thin film and said substrate;
   depositing a second conductive thin film atop said second glass thin film;
   forming a second resist layer on said second conductive thin film;
   forming openings through said second resist layer and second conductive films extending to said second glass thin film, thereby exposing selected portions of said second glass thin film; and
   removing the exposed portions of said second and first glass thin films by plasma etching, using said second conductive film as a mask.

16. A method as in claim 15 wherein said first glass thin film and said second conductive thin film are substantially thinner than said first conductive thin film and said second glass thin film.

17. A method as in claim 15 wherein said first glass film has a thickness of around 0.3 micrometers, and said first resist layer has a thickness of from around 0.5 to 1.5 micrometers.

18. A method as in claim 15 further comprising the steps of:
depositing a third conductive thin film atop said first and second conductive thin films;
depositing a third glass thin film atop said third conductive thin film;
forming a third resist layer on said third glass thin film;
forming openings through said third resist layer and third glass thin film extending to said third conductive thin film, thereby exposing selected portions of said conductive thin film; and
removing the exposed portions of said conductive thin film by plasma etching, using said third glass thin film as a mask.

19. A method as in claim 18 further comprising the steps of:
depositing a fourth glass thin film atop said third glass thin film and said third conductive thin film;
depositing a fourth conductive thin film atop said fourth glass thin film;
forming a fourth resist layer on said fourth conductive thin film;
forming openings through said third resist layer and fourth conductive film extending to said fourth glass thin film, thereby exposing selected portions of said fourth glass thin film; and
removing the exposed portions of said glass thin film by plasma etching, using said fourth conductive film as a mask.

* * * * *